(12) United States Patent
Teshima

(10) Patent No.: US 8,846,526 B2
(45) Date of Patent: Sep. 30, 2014

(54) THROUGH-HOLE SUBSTRATE AND METHOD OF PRODUCING THE SAME

(75) Inventor: Takayuki Teshima, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/884,461

(22) PCT Filed: Apr. 6, 2012

(86) PCT No.: PCT/JP2012/060093
§ 371 (c)(1),
(2), (4) Date: May 9, 2013

(87) PCT Pub. No.: WO2012/141278
PCT Pub. Date: Oct. 18, 2012

(65) Prior Publication Data
US 2013/0234343 A1    Sep. 12, 2013

(30) Foreign Application Priority Data

Apr. 14, 2011   (JP) ................. 2011-090122

(51) Int. Cl.
| | | |
|---|---|---|
| H01L 21/4763 | (2006.01) | |
| H05K 3/42 | (2006.01) | |
| H01J 1/46 | (2006.01) | |
| H01L 21/768 | (2006.01) | |
| C25D 3/00 | (2006.01) | |
| H01L 23/48 | (2006.01) | |
| C25D 5/02 | (2006.01) | |
| C25D 5/00 | (2006.01) | |
| H01J 9/14 | (2006.01) | |
| C23C 18/00 | (2006.01) | |

(52) U.S. Cl.
CPC ............ *H01L 21/76898* (2013.01); *H05K 3/42* (2013.01); *H01J 1/46* (2013.01); *C25D 3/00* (2013.01); *H01L 23/481* (2013.01); *C25D 5/02* (2013.01); *C25D 5/00* (2013.01); *C25D 5/022* (2013.01); *H01J 9/14* (2013.01); *C23C 18/00* (2013.01)

USPC ............ 438/637; 257/774; 257/76; 257/502; 257/621; 257/E23.011; 257/E23.174; 257/E23.167

(58) Field of Classification Search
CPC ................... H01L 21/4763; H01L 21/76802; H01L 21/76843; H01L 21/3114
USPC ............ 438/637; 257/774, 76, 502, 621, 698, 257/E23.011, E23.167, E23.174
See application file for complete search history.

(56) References Cited

U.S. PATENT DOCUMENTS

| | | |
|---|---|---|
| 4,047,077 A | 9/1977 | Veith |
| 4,112,329 A | 9/1978 | Veith |

(Continued)

FOREIGN PATENT DOCUMENTS

| | | |
|---|---|---|
| EP | 1 916 697 A1 | 4/2008 |
| JP | 6-246921 A | 9/1994 |

(Continued)

OTHER PUBLICATIONS

Katsumi Ura (ed.), "Electron and Ion Beam Optics," p. 48 (Aug. 1994).

(Continued)

*Primary Examiner* — Timor Karimy
(74) *Attorney, Agent, or Firm* — Fitzpatrick, Harper, Harper & Scinto

(57) ABSTRACT

A substrate (3) in which a through-hole (2) is filled with a filler (4) is prepared, and a structure (6), at least a part of the surface of which has an insulating property, is formed on the surface of the substrate (3). A plated layer (7) is formed on the substrate (3) having the structure (6) formed thereon, and the filler (4) and the structure (6) are removed. Thus, a through-hole substrate (8) is formed, in which the plated layer (7) having an opening (9) communicating with the through-hole (2) is provided on at least one surface of a substrate (1).

7 Claims, 5 Drawing Sheets

(56) References Cited

U.S. PATENT DOCUMENTS

| | | |
|---|---|---|
| 4,719,388 A | 1/1988 | Oess et al. |
| 5,738,977 A | 4/1998 | Van Der Sluis-Van Der Voort et al. |
| 5,863,371 A | 1/1999 | Takemoto et al. |
| 6,390,599 B1 | 5/2002 | Takemoto et al. |
| 8,247,907 B2 | 8/2012 | Sulfridge |
| 2003/0080675 A1 | 5/2003 | Chun et al. |
| 2005/0082964 A1 | 4/2005 | Konishi |
| 2005/0280350 A1 | 12/2005 | Seon |
| 2007/0181994 A1* | 8/2007 | Fukase et al. .................. 257/700 |
| 2009/0212680 A1 | 8/2009 | Tremsin et al. |
| 2013/0196501 A1 | 8/2013 | Sulfridge |

FOREIGN PATENT DOCUMENTS

| | | |
|---|---|---|
| JP | 2009-179030 A | 8/2009 |
| JP | 2011-090122 A | 5/2011 |
| TW | 200806126 A | 1/2008 |
| TW | 200937579 A | 9/2009 |
| WO | 98/50604 A1 | 11/1998 |

OTHER PUBLICATIONS

Office Action in Taiwanese Application No. 101113014 (dated Apr. 23, 2014).

* cited by examiner

THROUGH-HOLE SUBSTRATE AND METHOD OF PRODUCING THE SAME

TECHNICAL FIELD

The present invention relates to a through-hole substrate having a through-hole and a method of producing the through-hole substrate.

BACKGROUND ART

An electron lens is classified into an electromagnetic type and an electrostatic type. The electrostatic type has a simple configuration compared to the electromagnetic type and is advantageous in miniaturization and high integration. As an electrostatic lens used in an electron beam exposure device, for example, an einzel lens shown in Non Patent Literature 1 is generally used. Of three electrode substrates constituting the einzel lens, two electrode substrates at both upper and lower ends are generally supplied with an earth potential, and an intermediate electrode substrate is supplied with a negative or positive potential. Each electrode substrate has a circular opening, and the einzel lens generates a converging effect to an electron beam passing through the opening.

Although the electrostatic lens is easier to produce compared to a magnetic lens, the sensitivity of an optical aberration with respect to a production error of a lens opening is high. In particular, astigmatism is sensitive to the circularity of an opening. When the circularity is degraded, the electron beam converged by the electrostatic lens exhibits astigmatism or other high-order aberrations. An example of a method of forming an opening having a desired shape is photolithography. Patent Literature 1 discloses a method in which a light-curable resin film is formed on a plate with a nozzle hole formed therein, and the surface of the plate on which the light-curable resin film is not formed is exposed to light to fill the nozzle hole with the light-curable resin film. Then, according to this method, a plated layer containing water-repellent particles is formed from the principal plane of the plate having the nozzle hole filled with the light-curable resin film, and the light-curable resin film is removed to form a hole in the plated layer. Thus, the hole of the plated layer is similar in shape to the nozzle hole, and can be set to have an equal size of or to be larger than the nozzle hole. In this method, the light-curable resin film formed by photolithography is used as a mold, and hence the hole reflecting the shape of the light-curable resin film is formed in the plated layer.

CITATION LIST

Patent Literature

PTL 1: Japanese Patent Application Laid-Open No. 2009-179030

Non Patent Literature

NPL 1: "Electron and ion beam optics" Katsumi Ura, KYORITSU SHUPPAN, p. 48

SUMMARY OF INVENTION

Technical Problem

However, according to the above-mentioned method, the plate having the nozzle hole formed therein is used as a photomask, and hence the precision of a circular shape of the hole is poor, compared to that obtained from a photomask as used in conventional semiconductor photolithography. Therefore, it is not necessarily easy to form a structure of a light-curable resin film having a high circularity, which influences the circularity of an opening of the plated layer. Further, the structure of the light-curable resin film is similar in shape to the nozzle hole, and hence it is not necessarily easy to obtain an opening shape of the plated layer different from the nozzle hole. Further, in this method, it is impossible to hold the structure of the light-curable resin film that is smaller than the diameter of the nozzle hole with the plate having the nozzle hole. Thus, it is difficult to form a hole of a plated layer smaller than the diameter of the nozzle hole.

Solution to Problem

In view of the above-mentioned problems, a method of producing a through-hole substrate according to the present invention includes the following steps: preparing a substrate having a through-hole filled with a filler containing a material capable of being selectively removed with respect to the substrate; forming a structure, at least a part of a surface of which has an insulating property, in a region including at least a part of the through-hole on at least one surface of the substrate; forming a plated layer on the substrate having the structure formed thereon; and removing the filler and the structure after forming the plated layer.

Further, in view of the above-mentioned problems, through-hole substrate according to the present invention includes: a substrate having a through-hole; and an electroless plated layer provided with an opening having an opening diameter equal to or less than a diameter of the through-hole and communicating with the through-hole, the electroless plated layer being provided on at least one surface of the substrate.

Advantageous Effects of Invention

According to the present invention, the structure having a predetermined shape, at least a part of the surface of which has an insulating property, is formed on the substrate having the through-hole filled with the filler by photolithography, and thereby, the structure can be formed with good precision. Consequently, the shape of the structure formed with good precision is transferred to the plated layer, and hence the opening with high shape precision in terms of, for example, circularity can be formed in the plated layer. Further, even an opening having a shape different from that of the through-hole can be formed.

Further features of the present invention will become apparent from the following description of exemplary embodiments with reference to the attached drawings.

DESCRIPTION OF EMBODIMENT

Figure 1A:
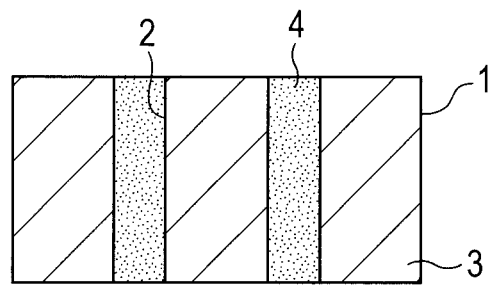
FIGS. 1A, 1B, 1C and 1D are cross-sectional views illustrating one embodiment of a method of producing a through-hole substrate of the present invention.

The feature of the present invention is as follows. That is, a structure having a predetermined shape, at least a part of the surface of which has an insulating property, is formed on a surface of a substrate having a through-hole filled with a filler, and after a plated layer is formed on the substrate, the filler and the structure are removed. Thus, a through-hole substrate having the plated layer with an opening communicating with the through-hole is produced. Based on this concept, one example of a through-hole substrate and a method of producing the same of the present invention has the above-mentioned basic configuration.

The following is also possible. The diameter of a contact surface of the structure with respect to the substrate (in the case where the structure has a columnar shape that is uniform in shape in a longitudinal direction, the diameter of the contact surface is equal to that of a cross-section of the structure) can be set to be smaller than that of the through-hole. With this, when the present invention is used in an electron lens, the diameter of the opening of the plated layer becomes smaller than that of the through-hole. In the case of the electron lens of this form, the influence of the circularity of the opening of the plated layer on an aberration is smaller as the diameter of the opening of the plated layer is larger, and thus a request for the circularity with high processing precision becomes low. On the other hand, the diameter of the contact surface of the structure with respect to the substrate can also be set to be larger than that of the through-hole. This can decrease an aspect ratio of the structure (aspect ratio refers to a ratio (h/w) of a height or depth h and a lateral width w of the structure), and hence the ease of production is enhanced. Further, along with this, when an insulating structure is formed of a photosensitive resin, the insulating structure can be produced without using a special light source. Further, the height of the insulating structure can also be increased. This enables the thickness of the plated layer to be increased, and the plated layer can be formed into a thick electrode, which enhances stiffness thereof. With production of a thicker electrode, the deformation caused by electrostatic suction at a time of application of a voltage can also be suppressed.

Further, the filler that fills the through-hole of the substrate can be made of a metal. In this case, the substrate has heat resistance, and hence the resistance to plating solution can be enhanced, and the number of kinds of metal that can be used as a plated metal material for forming an opening can be increased. Further, a seed layer can be formed in a region including at least a part of the through-hole on at least one surface of the substrate. This can enhance the contact property between the substrate and the plated layer. Further, the plated layer can be formed in a selected place of the substrate. Further, the plated layer can be formed as an electroless plated layer. According to this, unlike electroplating, it is not necessary to form the seed layer continuously, which can further decrease a film thickness distribution of the plated layer due to the edge effect. Further, a structure can also be obtained in which the plated layer is not connected between adjacent through-holes (see FIG. 3D), and hence the warpage of the substrate caused by plating stress can be reduced.

Hereinafter, the embodiment of the present invention is described in detail with reference to the drawings.

FIGS. 1A to 1D are schematic views of cross-sections illustrating the outline of one embodiment of a method of producing a through-hole substrate of the present invention.

In this embodiment, a substrate 3 is prepared, in which through-holes 2 of a substrate 1 having through-holes illustrated in FIG. 1A are filled with a filler 4 containing a material that can be selectively removed with respect to the substrate 1. As the substrate 1 having the through-holes, inorganic materials such as silicon, glass, and quartz, or organic resin materials such as acryl, polyethylene terephthalate, vinyl chloride, polypropylene, and polycarbonate can be used. Further, these substrate materials are selected from materials which have a resistance to a plating solution to be used. As the material for the filler 4, an inorganic material, an organic material, or a mixture thereof can be used. An example of the inorganic material is metal, and copper, nickel, iron, gold, zinc, chromium, tin, and an alloy thereof can be used. As the organic material, resins such as a polyolefin-based resin, a polyamide-based resin, a polyester-based resin, a polyurethane-based resin, a polyacrylic resin, a polyvinyl chloride-based resin, a polyvinyl-based resin, a petroleum-based resin, a polystyrene-based resin, a vinyl acetate-based resin, and a cellulose-based resin, or a mixture thereof can be used. Further, the material for the filler is selected from materials each having a resistance to a plating solution to be used. Further, the material for the filling is selected from materials that can be selectively removed with respect to the substrate. It is not necessarily required that the through-holes be filled completely with the filler, and there may be a step difference between the through-hole and the filler. For example, the filler may protrude from an opening end of the through-hole, or the filler may be recessed from the opening end of the through-hole. This is because, in any case, structures 6 described later can be formed without trouble respectively in a region including at least a part of the opening end of the through-hole.

Figure 1B:
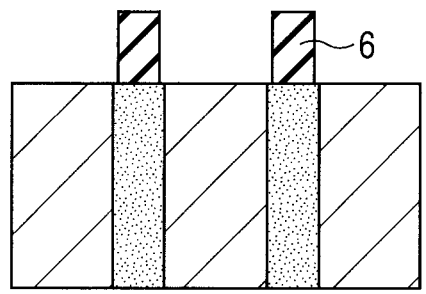
Figure 1C:
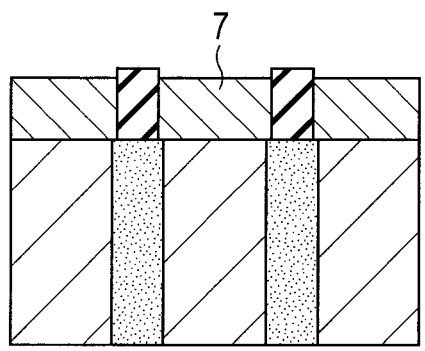

In this embodiment, each of the structures 6, at least a part of the surface of which has an insulating property, is formed in a region including at least a part of the opening end of the through-hole (FIG. 1B). FIG. 1B illustrates, as an example, a state in which the insulating structures 6 are formed over the filler that fill the through-holes. The reason for insulating at least a part of the surface of the structure 6 is as follows. First, at least the top surface of the structure 6 is insulated so that a plated layer is not formed thereon. When the plated layer is formed on the top surface of the structure 6, even when the structure 6 and the filler 4 are removed later, an opening 9 is capped to eliminate the through-hole. Second, the contact property between the plated layer and the insulating surface of the structure 6 is reduced to make it easy to remove the structure 6 later, and the process of forming the plated layer to be formed around the structure 6 is performed in a preferred manner. In this respect, even a structure whose parts other than the top surface are conductive (for example, a structure in which an insulating layer is formed on the top surface of a cylindrical metal) can be used, as long as the conductive parts of the structure can be selectively removed with respect to the plated layer. Typically, the entire structure may be formed of an insulating material. However, at least which part of the surface is required to be insulated depends upon the shape of the structure, and hence is determined from the viewpoint of the through-hole formability for each case. Further, the shape of the structure can be appropriately adjusted depending upon the object that which shape the opening of the through-hole substrate (substrate having through-holes) is required to have. For example, in the case where it is desired to form a circular opening, a cylindrical structure having a circular shape in cross-section may be formed. Similarly, in the case of obtaining an oval opening, a columnar structure having an oval shape in cross-section may be formed. Further, in the case of obtaining a polygonal opening, a columnar structure having a polygonal shape in cross-section may be formed.

In this embodiment, the size relationship between the diameter of the contact surface of the structure 6, at least the surface of which has an insulating property, and the substrate 3, and the diameter of the through-hole 2 is determined by the intended use of the through-hole substrate. When the diameter of the contact surface with respect to the substrate 3 is larger under the condition of the same height of the structure 6, the aspect ratio of the structure becomes smaller, which facilitates the production. Further, the cross-section of the structure 6 in a direction normal to the substrate 3 may be tapered or reversely tapered. Herein, the diameter refers to a diameter in the case of a circular shape, and refers to a longest side or a shortest side in the case of an oval or a polygon.

In this embodiment, the structure 6, at least the surface of which has an insulating property, can be formed by photolithography through use of a photoresist. The photolithography technology is used in the production of various electronic devices typified by the IC field, and enables a photosensitive material to be formed with good precision. As the photolithography, not only a method using UV-light but also X-ray lithography using radiation light can be used. Further, a structure can also be formed by electron beam exposure when an electron beam resist is used. Materials that can be used for the structure 6 are selected from materials which have a resistance to a plating solution to be used. Further, as long as the structure 6 having a desired shape as the opening shape is obtained, the method of forming the structure is not limited to the above-mentioned methods. For example, if the required conditions are satisfied, a structure can also be formed by exposure to light through use of a stencil mask. Further, after a structure is formed of a conductive material, an insulating layer may be formed on the surface thereof.

Next, a plated layer 7 is formed on the substrate 3 (FIG. 1O). At this time, the shape of the insulating structure 6 formed by photolithography is transferred to the plated layer 7. The plated layer 7 can be formed by electroless plating, electroplating, or a combination thereof. In the case of the electroplating, the distribution of the film thickness of a plated layer tends to increase due to the edge effect. Therefore, it is preferred to use electroless plating. In order to align the thickness of the plated layer 7 after being formed, the plated layer 7 may be polished or etched.

A seed layer 5 may be formed on the surface of the substrate 3 filled with the filler (for example, see FIGS. 4A to 4E). The seed layer 5 can be formed by any method such as spin coating, spraying, dipping, vacuum sputtering, electron-beam evaporation, or chemical vapor deposition (CVD). Further, when it is desired that the plated layer be formed only in a desired region, the seed layer may be patterned (for example, see FIGS. 3A to 3E). Further, a palladium catalyst or the like may be adsorbed to the surface of the substrate, and a palladium catalyst layer thus obtained may be used as the seed layer. When the substrate 1 having through-holes has conductivity, or the contact property between the substrate and the plated layer is satisfactory, it is not necessarily required to form a seed layer. Here, the plated layer is not formed in a region where the insulating structure is formed on the seed layer. In the case of forming the plated layer only in a desired region, the seed layer is patterned, or the seed layer is exposed only in a desired region through use of a photoresist or the like. In the case of electroplating, an electric current is allowed pass through the seed layer to form a plated layer. The materials for the seed layer are selected from materials which have a resistance to a plating solution to be used. In the case of electroless plating, the seed layer functions as an adsorption layer of a catalyst capable of generating electroless plating nuclei effectively. Further, the seed layer also functions as a contact layer between the substrate having through-holes and the plated layer.

Figure 1D:
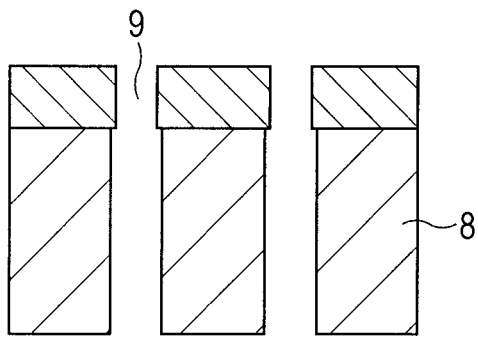
Figure 2A:
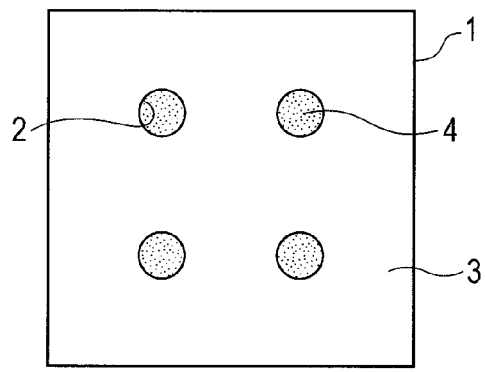
FIGS. 2A, 2B, 2C and 2D are top views illustrating the one embodiment of the method of producing a through-hole substrate of the present invention.
Figure 2B:
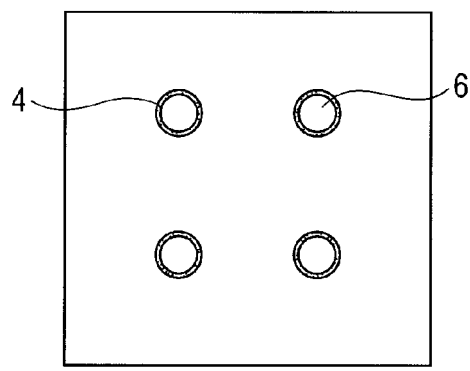
Figure 2C:
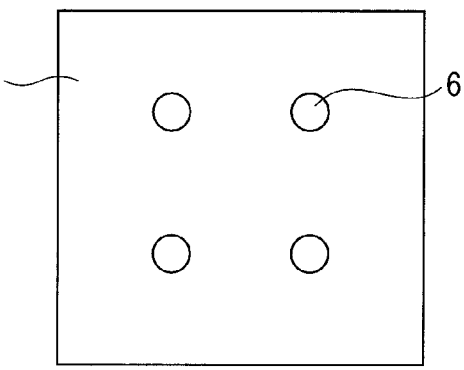
Figure 2D:
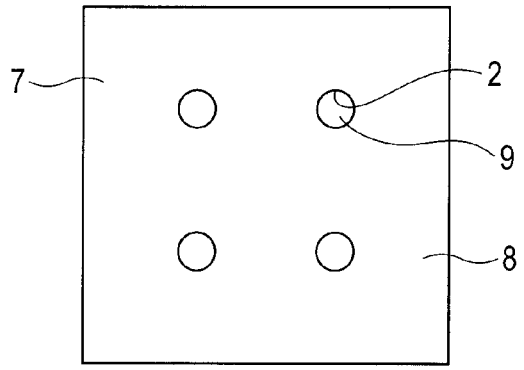

Next, after the plated layer 7 is formed, the filler 4 and the structure 6 are removed (FIG. 1D). When the structure 6 is removed, the opening 9 of the plated layer 7, to which the shape of the structure formed with good precision by photolithography has been transferred, is obtained. The filler 4 and the structure 6 can be removed by etching. The removal order of the filler 4 and the structure 6 is not specified. In the case where the diameter of the structure 6 is larger than that of the through-hole 2, the filler is removed after the structure is removed. In the case where the diameter of the structure 6 is smaller than that of the through-hole 2, the structure can be lifted off by etching the filler. Further, when an etchant capable of etching both the filler and the structure is used, both of them can be removed at almost the same time. The etchant to be used is selected from etchants which cannot etch the substrate 1 having through-holes and the plated layer 7. Further, the seed layer may be removed, if required. FIGS. 2A to 2D illustrate the states of FIGS. 1A to 1D, respectively, seen from above.

Hereinafter, the present invention is described in more detail by way of specific examples.

First Example

A first example is described with reference to FIGS. 3A to 3E. In this example, a substrate 3 filled with a filler 4 is prepared as follows. A 4-inch silicon wafer having a thickness of 100 μm with a double-sided mirror surface is prepared, and a chromium film of 2,000 Å is formed on each surface of the silicon wafer by an electron-beam evaporation device. Each of the surfaces is coated with a positive resist, and patterning is performed by photolithography so that a resist opening pattern of 30 μmφ is arranged two-dimensionally at a pitch of 38 μm. After that, the chromium film is etched with a chromium etching solution to expose the silicon. The exposed silicon is subjected to anisotropic deep etching by ICP-RIE to form through-holes 2, and thus, a substrate 1 having through-holes is obtained. Then, the resist and the chromium film are removed by UV ozone ashing and with a chromium etching solution. Then, the substrate 1 is placed in a thermal oxidation furnace to form a thermally-oxidized film of 1,000 Å on the surface thereof.

Next, a substrate in which the substrate 1 having through-holes is combined with a stainless film is prepared as follows. Polyoxyethylene lauryl ether (melting point: 34° C.) is used as a non-ionic surfactant and is dissolved in a mixed solvent of cyclopentanone and acetone (weight ratio of 3:1) to prepare 10% by weight of a polyoxyethylene lauryl ether solution. This solution is spin-coated to the stainless film and left at room temperature for 15 minutes. Then, a solid of polyoxyethylene lauryl ether is deposited on the stainless film, and a non-ionic surfactant layer is formed.

The substrate 1 having through-holes is placed and overlapped on the non-ionic surfactant layer on the stainless film, and placed on a hot plate heated to 70° C. Then, the polyoxyethylene lauryl ether is melted, and the stainless film and the substrate 1 having through-holes adhere to each other. After that, when the substrate 1 is cooled to room temperature, the polyoxyethylene lauryl ether becomes a solid, and the stainless film and the substrate 1 having through-holes adhere to each other strongly. This substrate is soaked in a beaker containing ion exchange water for 3 minutes. When the through-holes 2 are observed, the polyoxyethylene lauryl ether is eluted from the through-holes 2 to expose the stainless film under the through-holes 2.

In this example, copper is used as the filler 4, and filler is conducted by electroplating. The above-mentioned substrate is soaked in a copper sulfate plating solution, and a current is allowed pass through the stainless film at 48 mA for 5 hours at room temperature. Plating is conducted until a plated layer of copper protrudes from the through-holes 2. As a positive electrode of copper sulfate plating, a copper plate containing phosphorus is used. The copper sulfate plating solution prepared with the following composition is used.

| | |
|---|---|
| Copper sulfate-pentahydrate | 200 (g/L) |
| 98% concentrated sulfuric acid | 14 (mL/L) |
| 35% hydrochloric acid | 0.09 (mL/L) |
| Cu-Brite VFII-A (manufactured by EBARA-UDYLITE CO., LTD.) | 20 (mL/L) |
| Cu-Brite VFII-B (manufactured by EBARA-UDYLITE CO., LTD.) | 1 (mL/L) |

Figure 3A:
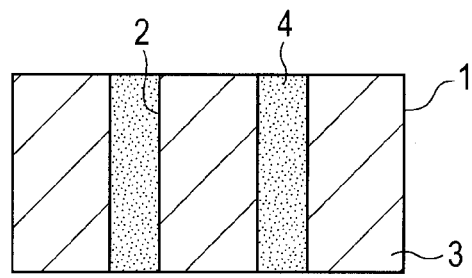
FIGS. 3A, 3B, 3C, 3D and 3E are cross-sectional views illustrating a first example of the present invention.
Figure 3B:
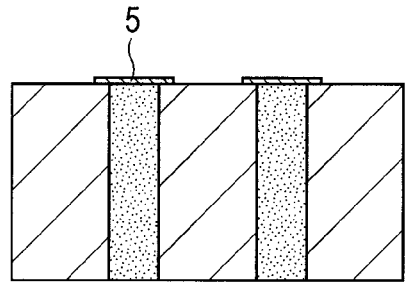

After the plating, the stainless film is picked up with tweezers, and only the stainless film is displaced in a direction parallel to the substrate surface to be peeled. A portion in which the plated layer protrudes is polished by chemical mechanical polishing (CMP), and the substrate thus obtained is used as the substrate 3 filled with the filler 4 (FIG. 3A). Next, a chromium film of 50 Å and a copper film of 500 Å are formed in this order on one surface of the substrate 3 filled with the filler by an electron-beam evaporation device. The copper film is coated with a positive resist, and a resist circular pattern of 45 μmϕ is formed on each through-hole 2 by photolithography. After that, the copper film and the chromium film are etched successively to remove the resist, and thereby, a circular seed layer 5 of 45 μmϕ is formed so as to cover the through-hole 2 (FIG. 3B).

Figure 3C:
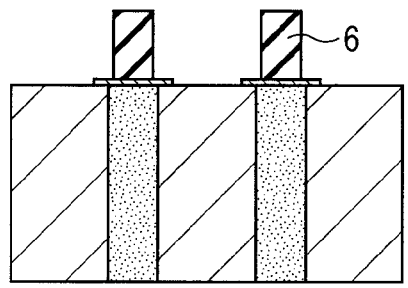

In this example, SU-8 (Kayaku Microchem Co., Ltd.) that is a negative resist is used as the structure 6 whose surface has an insulating property. The seed layer 5 is coated with SU-8, and a resist circular pattern of 26 μmϕ with a height of 10 μm is formed on the seed layer 5 on each through-hole 2 by photolithography. The resist is cured on a hot plate at 200° C. With this, a columnar structure is formed (FIG. 3C).

Figure 3D:
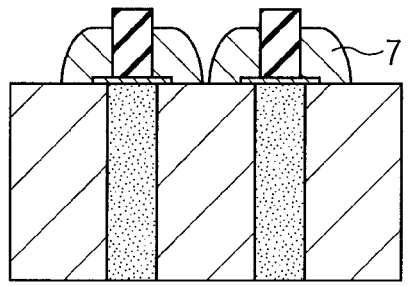
Figure 3E:
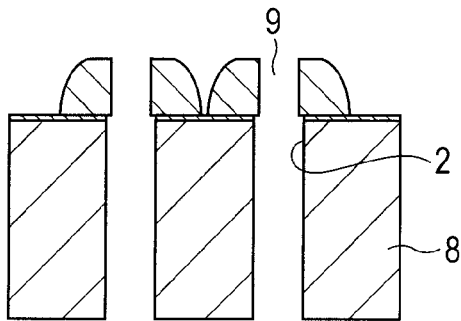

In this example, electroless palladium plating is used as a plated layer 7. Tin is allowed to adsorb to the seed layer 5 through use of a hydrochloric acid solution of stannous chloride, and then the substrate is washed with water. After that, the substrate is soaked in a solution containing palladium ions and washed with water again. Then, electroless palladium plating is conducted. When plating is conducted at a plating solution temperature of 50° C. for 8 hours with an electroless palladium plating solution (LECTROLESS Pd2000S, manufactured by Electroplating Engineers of Japan Ltd.), the electroless palladium plated layer 7 having a thickness of 6 μm is obtained (FIG. 3D).

Then, when being impregnated with a mixed aqueous solution of concentrated sulfuric acid and a hydrogen peroxide solution heated to 50° C., SU-8 (structure 6) is dissolved. After washing with water, the seed layer 5 is etched with a chromium etchant. After washing with water, copper of the filler 4 is etched and removed by copper etching. Thus, a through-hole substrate 8 having openings 9 in the electroless palladium plated layer 7 is obtained. The shape of the structure 6 is transferred to the opening 9, and hence the opening 9 with high circularity and high shape precision is obtained. Thus, a through-hole substrate can be produced in which the substrate is made of silicon, the filler is made of copper, the seed layer is made of copper and chromium and is patterned in advance, the structure is made of a SU-8 resist, the plated layer is made of electroless palladium, and the diameter of the through-hole is larger than that of the structure. The through-hole substrate is provided with an electroless plated layer with an opening having an opening diameter equal to or less than the diameter of the through-hole and communicating with the through-hole. When such a through-hole substrate is used as an electrostatic lens, the circularity of the opening 9, in particular, is high, and hence astigmatism or other high-order aberrations of a converged electron beam is reduced.

Comparative Example

A comparative example is described. In this comparative example, a 4-inch silicon wafer having a thickness of 100 μm with a double-sided mirror surface is prepared, and a chromium film 2,000 Å is formed on each surface of the silicon wafer by an electron-beam evaporation device. Each of the surfaces is coated with a positive resist, and patterning is performed by photolithography so that a resist opening pattern of 26 μmϕ is arranged two-dimensionally at a pitch of 38 μm. After that, the chromium film is etched with a chromium etching solution to expose the silicon. The exposed silicon is subjected to anisotropic deep etching by ICP-RIE until the silicon is passed through. According to this production method, an opening on the passing-through side has a deformed circular shape. Further, unlike the opening shape formed with a resist, the opening on the surface from which etching is started also has degraded circularity compared to that of the circular opening shape of the resist.

Second Example

Figure 4A:
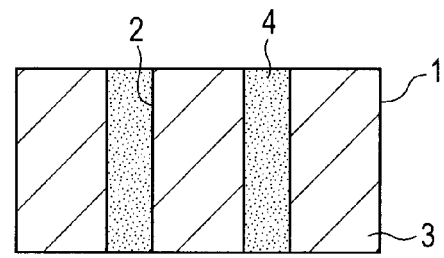
FIGS. 4A, 4B, 4C, 4D and 4E are cross-sectional views illustrating a second example of the present invention.
Figure 4B:
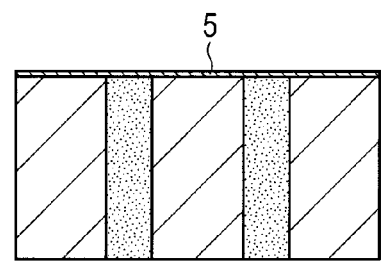
Figure 4C:
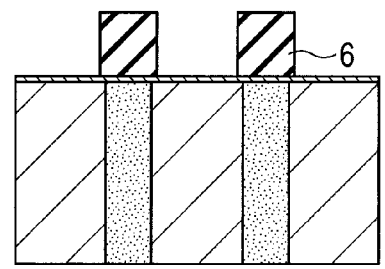

A second example is described with reference to FIGS. 4A to 4E. In the second example, a substrate 3 filled with a filler 4 is prepared by the same method as that of the first example, except that the filler is made of nickel (FIG. 4A). Next, a chromium film of 50 Å and a copper film of 500 Å are formed in this order on one surface of the substrate 3 filled with the filler by an electron-beam evaporation device. Thus, a seed layer 5 is formed (FIG. 4B). Here, as the structure 6 whose surface has an insulating property, SU-8 (Kayaku Microchem Co., Ltd.) that is a negative resist is used. The seed layer 5 is coated with SU-8, and a resist circular pattern of 34 μmϕ with a height of 13 μm is formed on the seed layer 5 on each through-hole 2 by photolithography. The resist is cured on a hot plate at 200° C. (FIG. 4C). With this, the structure 6 whose surface has an insulating property is formed. Here, the diameter of the structure 6 is larger than that of the through-hole 2.

Figure 4D:
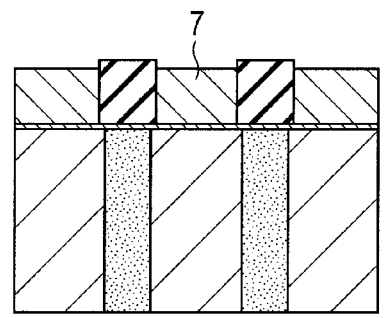

Further, in this example, platinum electroplating is used as a plated layer 7 (FIG. 4D). When plating is conducted at a plating solution temperature of 60° C. and a current density of 1 A/dm$^2$ for 2 hours with a platinum plating solution (PRECIOUSFAB Pt3000, manufactured by Electroplating Engineers of Japan Ltd.), the platinum plated layer 7 having a thickness of 12 μm is obtained.

Figure 4E:
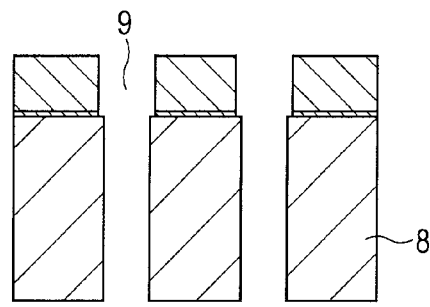

Then, when being impregnated with a mixed aqueous solution of concentrated sulfuric acid and a hydrogen peroxide solution heated to 50° C., SU-8 (structure 6) is dissolved. After washing with water, the seed layer 5 is etched with a chromium etchant. After washing with water, nickel of the filler 4 is etched by nickel etching (FIG. 4E). Thus, a through-hole substrate 8 including the platinum plated layer 7 with the opening 9 is obtained. The shape of the structure 6 as a mold member is accurately transferred to the opening 9, and hence the opening 9 with high circularity and high shape precision is obtained.

Third Example

Figure 5A:
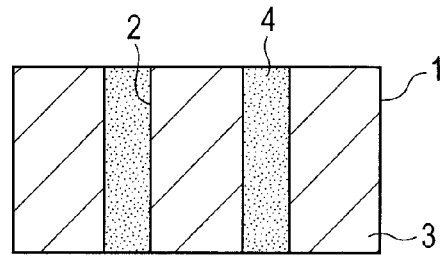
FIGS. 5A, 5B, 5C, 5D and 5E are cross-sectional views illustrating a third example of the present invention.
Figure 5B:
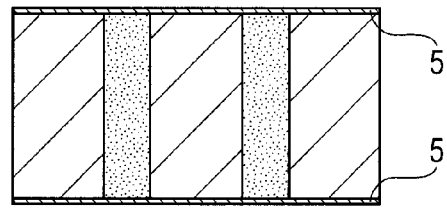

A third example is described with reference to FIGS. 5A to 5E. In this example, a substrate 3 filled with a filler 4 is prepared by the same method as that of the first example (FIG. 5A). Then, a chromium film of 50 Å and a copper film of 500 Å are formed in this order on each surface of the substrate 3 filled with the filler 4 by an electron-beam evaporation device. Thus, a seed layer 5 is formed (FIG. 5B).

Figure 5C:
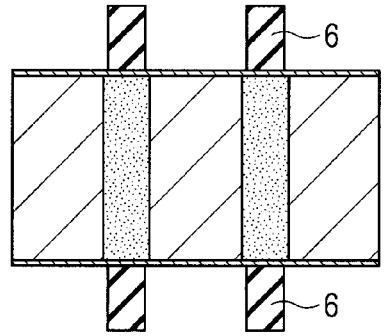

In this example, a structure 6 whose surface has an insulating property is formed on both surfaces of the substrate 3 filled with the filler (FIG. 5C). Here, SU-8 (Kayaku Microchem Co., Ltd.) that is a negative resist is also used as the structure 6 whose surface has an insulating property. The seed layer 5 is coated with SU-8, and a resist circular pattern of 26 µmφ with a height of 10 µm is formed on the seed layer 5 on each through-hole 2 by photolithography. The resist is cured on a hot plate at 200° C. The structure 6 whose surface has an insulating property is formed similarly on the other surface (FIG. 5C).

Figure 5D:
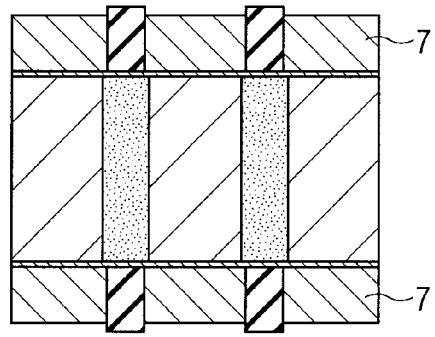

In this example, electroless palladium plating is used as a plated layer 7. Tin is allowed to adsorb to the seed layer 5 through use of a hydrochloric acid solution of stannous chloride, and then the substrate is washed with water. After that, the substrate is soaked in a solution containing palladium ions and washed with water again. Then, electroless palladium plating is conducted. When plating is conducted at a plating solution temperature of 50° C. for 7 hours with an electroless palladium plating solution (LECTROLESS Pd2000S), the electroless palladium plated layer having a thickness of 5 µm is obtained (FIG. 5D).

Figure 5E:
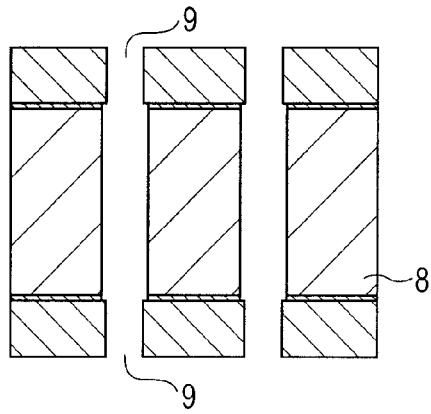

Then, when being impregnated with a mixed aqueous solution of concentrated sulfuric acid and a hydrogen peroxide solution heated to 50° C., SU-8 (structure 6) is dissolved. After washing with water, the seed layer 5 is etched with a chromium etchant. After washing with water, copper of the filler 4 is etched and removed by copper etching (FIG. 5E). Thus, a through-hole substrate 8 including the electroless palladium plated layers 7 with openings 9, which are provided on both surfaces of the through-hole substrate 8, is obtained. The shape of the insulating structure 6 is transferred to the opening 9, and hence the opening 9 with high circularity and high shape precision is obtained.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-090122, filed Apr. 14, 2011, which is hereby incorporated by reference herein in its entirety.

The invention claimed is:

1. A method of producing a through-hole substrate, comprising:
   preparing a substrate having a through-hole filled with a filler containing a material capable of being selectively removed with respect to the substrate;
   forming a structure, at least a part of a surface of which has an insulating property, in a region including at least a part of the through-hole on at least one surface of the substrate;
   forming a plated layer on the substrate having the structure formed thereon; and
   removing the filler and the structure after forming the plated layer.

2. The method of producing a through-hole substrate according to claim 1, wherein a diameter of a contact surface of the structure and the substrate is smaller than a diameter of the through-hole.

3. The method of producing a through-hole substrate according to claim 2, wherein the structure is formed on the filler that fills the through-hole.

4. The method of producing a through-hole substrate according to claim 1, wherein a diameter of a contact surface of the structure and the substrate is larger than a diameter of the through-hole.

5. The method of producing a through-hole substrate according to claim 1, wherein the filler is a metal.

6. The method of producing a through-hole substrate according to claim 1, further comprising forming a seed layer in a region including at least a part of an opening end of the through-hole on at least one surface of the substrate.

7. The method of producing a through-hole substrate according to claim 1, wherein the plated layer is an electroless plated layer.

* * * * *